United States Patent
Chan et al.

(10) Patent No.: US 7,738,259 B2
(45) Date of Patent: Jun. 15, 2010

(54) SHARED VIA DECOUPLING FOR AREA ARRAYS COMPONENTS

(75) Inventors: Alex L. Chan, Nepean (CA); Paul Brown, Wakefield (CA); Charles M. Elliott, Ottawa (CA)

(73) Assignee: Alcatel Lucent, Paris (FR)

( * ) Notice: Subject to any disclaimer, the term of this patent is extended or adjusted under 35 U.S.C. 154(b) by 556 days.

(21) Appl. No.: 10/761,343

(22) Filed: Jan. 22, 2004

(65) Prior Publication Data

US 2005/0162839 A1    Jul. 28, 2005

(51) Int. Cl.
*H05K 7/00* (2006.01)

(52) U.S. Cl. .................. 361/777; 361/760; 361/767; 361/768

(58) Field of Classification Search .......... 361/777, 361/760, 744, 767, 768
See application file for complete search history.

(56) References Cited

U.S. PATENT DOCUMENTS

| | | | |
|---|---|---|---|
| 5,847,936 A | | 12/1998 | Forehand et al. |
| 6,037,677 A | * | 3/2000 | Gottschall et al. ............. 307/43 |
| 6,175,158 B1 | * | 1/2001 | Degani et al. ................ 257/777 |
| 6,198,635 B1 | | 3/2001 | Shenoy et al. |
| 6,594,811 B2 | * | 7/2003 | Katz .......................... 716/12 |
| 6,834,427 B2 | * | 12/2004 | Cornelius et al. ............. 29/840 |
| 2003/0043560 A1 | * | 3/2003 | Clarkson et al. ............ 361/782 |
| 2003/0183419 A1 | * | 10/2003 | Miller et al. ................ 174/261 |
| 2004/0003941 A1 | * | 1/2004 | Duxbury et al. ............. 174/261 |
| 2004/0040744 A1 | * | 3/2004 | Wyrzykowska et al. ..... 174/262 |
| 2004/0061241 A1 | * | 4/2004 | Osburn et al. ............... 257/786 |
| 2004/0099440 A1 | * | 5/2004 | Kwong et al. ............... 174/260 |
| 2004/0216916 A1 | * | 11/2004 | Wyrzykowska et al. ..... 174/255 |

FOREIGN PATENT DOCUMENTS

EP    1347674    9/2003

OTHER PUBLICATIONS

Julian Partridge: "Incorporating BGAS into high volume assembly operations" Electronic Packaging and Production,. Cahners Pubishing Co Newton, Mass. U.S. Aug. 1997 vol. 37.

* cited by examiner

*Primary Examiner*—Jinhee J Lee
*Assistant Examiner*—Hoa C Nguyen
(74) *Attorney, Agent, or Firm*—Kramer & Amado P.C.

(57) ABSTRACT

A solution for mounting decoupling capacitors on a printed wiring board (PWB) used for mounting a high performance ball grid array (BGA) device is described. The via array that connects the BGA device is modified, the modification being that at least a portion of one row of said vias array is missing at least two adjacent vias. The missing vias are replaced by respective shared vias in an adjacent row, and the shared vias are connected to either a power supply or a power return. The shared vias are also provided with via pads on the other side of said PWB, and a decoupling capacitor can be electrically connected across the pair of via pads to decouple the power supply and the power return at the two adjacent vias.

12 Claims, 4 Drawing Sheets

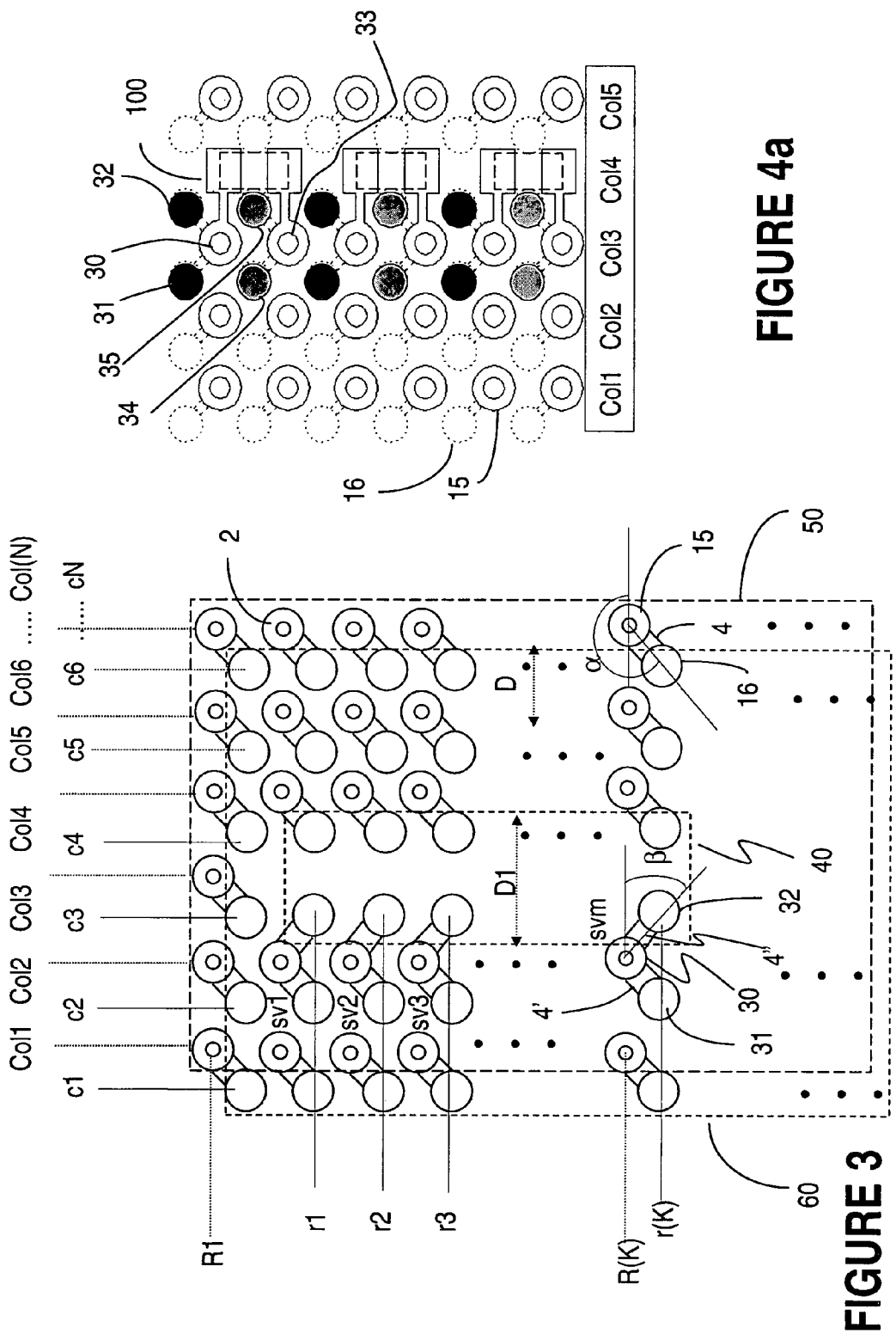

SHARED VIA DECOUPLING FOR AREA ARRAYS COMPONENTS

FIELD OF THE INVENTION

The invention is directed to high performance IC (integrated circuit) packages and in particular to facilitating the decoupling or termination of ball grid array (BGA) type packaging.

BACKGROUND OF THE INVENTION

The demand for high density, highly integrated, multi-functional and high performance electronic circuits resulted in dramatic evolution of electronic device packaging, substrate design and mounting technologies.

The packaging technologies have evolved to produce finer pitch and higher pin count integrated circuits. For example, the number of leads (I/O pins) on an ASIC (application specific integrated circuit) evolved over the last few years from 800 to 1800. The leads form a pattern that occupies the entire area on the "back" of the IC; a 1.00 mm pitch is common today.

To meet the demand for packages having higher lead counts and smaller footprints, grid array packaging, such as ball grid arrays (BGAs), plastic BGAs (PBGAs), organic LAN grid arrays (OLGAs), etc, were developed. A BGA package typically has leads (or pins or I/O terminals) arranged in an array of solder balls, protruding from the bottom of the package. These terminals are soldered to a plurality of pads/balls located on the surface of the electronic substrate. Specific arrangements of power and ground leads are selected with a view to improving signal quality on signal contacts.

Printed wiring boards (PWBs), such as printed circuit boards, chip carriers or multichip modules, are well known examples of electronic substrates. PWBs usually comprise layers of conductive and dielectric materials laminated together. Some of the layers include traces or signal lines, prepared by methods well known in the art on a dielectric layer, some ground and some power planes comprised of a sheet of metal placed on a dielectric layer. The design of the PWBs evolved in parallel with the design of the ICs and electronic components. Thus, in order to accommodate the routing of ICs and components designed with a given pitch (1.27 mm, 1.00 mm, 0.8 mm or less), the distance permitted between the traces, and between the traces and the mounting pads for the ICs and components, as well as the width of the traces must decrease accordingly. Of relevance is also the design and placement of the vias and mounting pads for the ICs and the components.

Vias are formed in the PWBs to permit routing on inner layers as well as to make electrical connection between the ICs and the components mounted on the opposite side of the board. When used for mounting a component, the respective vias are provided with a pad, that ensures the electrical connection. Alternatively, a via may be connected to an adjacent ball contact pad over a short "dogbone" connection, for enabling connection to a corresponding ball on an IC or a component.

There are various types of vias. For example, the plated through hole (PTH) vias go all the way through the board. Blind vias generally go from a board surface layer through a few layers only, while the buried vias connect traces on two internal layers of the board.

It is also known that the decoupling capacitors required for high-performance operation of the electrical circuits need to be mounted as close as possible to an IC. The number of capacitors needed for proper operation of an IC increases not only with the number of circuits in the IC package, but also with the number of power and ground connections provided on the respective IC package. This is not easy, since the area under the IC is occupied by the via array used to connect the IC to the board. As many of the power and ground vias are in the middle of the array, the number of the routes within the array is limited, since the distance between the vias (pitch) of the array is very small. This problem is compounded by the increase in the number of the IC ground and power connections, as larger IC integration is achieved. Still further, the layout of the IC ground and power pins is different for different ICs, so that specific mounting solutions need to be provided for the decoupling capacitors.

As a result, various solutions are available today for mounting the BGA devices and the respective decoupling capacitors. These solutions depend on the position of the power and ground leads, pitch, the size of the area occupied by the IC device, the size of the pads on the board, the type and technology used for the vias, etc. Preferably, the decoupling capacitors are placed on the back side of the board from the IC when mounted. However, the space within the vias array on back of the board is not normally available because the vias are very close.

One solution currently being used consists of PTH (plated through hole) vias used for "Via in Pad (ViP)" solution. In this case, the vias go straight from the front to the back of the board and the capacitors are placed on the "back side" of the board. The assumption in this case is that vias cannot be depopulated and that the capacitors must be connected as close as possible to the power and ground balls. The drawbacks of this solution are that the IC is required to have the power and ground pins configured in a very specific fashion. In addition, the power and ground pins that require decoupling need to be separated by either a signal or unused pin to accommodate the size of the capacitors. This pin is covered by the body of the decoupling capacitor, so it cannot be accessed for testing. Also, the power and ground PTHs in the array must be provided with pads, leaving little space for routes; connections may not be traced between a capacitor and the adjacent unused vias. Still further, the number of decoupling capacitors that can be mounted in this way is limited since the solution requires a via row/column free between a row/column of capacitors.

Another solution currently employed in recent designs uses advanced PWB technology. This solution consists of using HDI on the PWB with the combination of blind and buried vias to allow access on the backside of the BGA component. This option provides the highest degree of freedom for the design. In this case, component pitch, pin arrangement and capacitor size do not need to be specified, since the front-to-back connection enables use of many combinations. It is also possible to maximize the number of decoupling capacitors that can fit into the available space. However, this may increase cost of the product due to potentially higher board costs.

There it is also known to provide a routing channel in the array of vias on the "back side" of the board from where the IC is mounted, as for example described in the US Patent Application Publication 2003/0183419A1 (Miller et al.), published on Oct. 2, 2003. This Patent Application discloses a pattern of columns and rows of vias, each via being associated with a pad over a short connection. The pads are arranged between the columns and the rows of vias, so that the connections form a certain angle. A routing channel is obtained between two columns (or two rows) of vias, by changing the angle of the pad in two of the two adjacent rows. For example, if the connections associated with the vias in the right column form a 45° angle with the horizontal, the connections associated with the vias in the left column will form a complementary angle of 135° angle. The channel is used, as the name indicates, for routing traces from the vias in the core of the array.

Finding new and acceptable solutions for mounting the decoupling capacitors for high performance chip package is always a struggle. As discussed, this is because of the changes in new packages using tighter pitches as well as different power and ground configurations than previous designs. Still further, the location available for mounting a decoupling capacitor is dictated by the overall configuration of the circuit layout and via configurations on a respective printed circuit board. As a result, new solutions need to be introduced as new packages are introduced.

There is a need to provide improved decoupling solutions for 1.27 mm, 1.00 mm and 0.8 mm pitch and below BGA components, which allow grid array mounting and packaging technologies to be more successfully implemented and further improved.

SUMMARY OF THE INVENTION

It is an object of the invention to provide a decoupling solution that leverages the shared via arrangement being used on a growing number of BGA devices thereby alleviating totally or in part the drawbacks of the prior art solutions.

Accordingly, the invention is directed to a printed wiring board (PWB) for mounting a high performance ball grid array (BGA) device on one side of the PWB, comprising: a modified vias array, the modification being that at least a portion of one column or row of the vias has been replaced by respective shared vias in an adjacent row, and the shared vias have been connected to either a power supply or a power return; and a via pad for each shared via located on the other side of the PWB in the portion, whereby a decoupling capacitor can be electrically connected across the via pads to decouple the power supply and the power return at the two adjacent vias.

Still further, the invention provides a printed wiring board (PWB) for mounting a high performance integrated circuit, comprising: on a top side of the PWB, a modified ball grid array (BGA) land pattern with BGA columns and BGA rows of ball connection pads; a modified vias array of plated through hole (PTH) vias, with each via column Col(n) arranged between two respective BGA columns c(n) and c(n+1) and each via row R(k) arranged between two respective BGA rows r(k) and r(k+1), wherein 2m vias of the via column Col(n) placed in successive via rows R(k) to R(k+2m−1) of the modified vias array are depopulated to obtain a free space on the back side of the PWB, and wherein 2m corresponding vias in a via column C(n+1) adjacent to the column Col(n) and placed in the successive rows R(k) to R(k+2m−1) of the vias array are shared vias.

Still further, the present invention is directed to a method for mounting a decoupling capacitor on a printed wiring board (PWB) having a land pattern for mounting a BGA device on one side and a via array for connecting the BGA device to the PWB. The method comprises depopulating at least two adjacent vias in a portion of a first row of the vias array; replacing the depopulated vias by a pair of shared vias in a second row, adjacent to the first row; connecting the shared vias to a power supply and a power return respectively, and providing a respective via pad for each shared via on the other side of the PWB in the portion; and electrically connecting the decoupling capacitor across the pair of shared vias to decouple the power supply and the power return at the two adjacent vias.

Advantageously, the cost of implementing the solution proposed by the present invention is low because it uses standard PTH (Plated Through Hole) technology on the PWB.

Another advantage of the invention resides in the ability to use standard technologies to process the capacitor on the product, in contrast to the PTH ViP solution where careful design on land pattern and significance process development was involved. This also avoids use of other technologies, such as filled vias, to accomplish the same task which in some of these technologies is considered to be currently unstable and expensive.

BRIEF DESCRIPTION OF THE DRAWINGS

The foregoing and other objects, features and advantages of the invention will be apparent from the following more particular description of the preferred embodiments, as illustrated in the appended drawings, where:

FIG. 1b is a photograph of capacitors mounted on a board using the ViP solution of FIG. 1a;

FIG. 3 is a top view of the circuit board showing how use of shared vias enables creating routing channels;

FIG. 4a is a back view of the circuit board showing a shared via pattern for providing a free space for mounting the decoupling capacitors according to the invention;

DETAILED DESCRIPTION

The solution proposed herein takes advantage of power and ground pin locations on BGA components that are designed with a view to enable creation of routing channels in the vias array used for connecting the component to the board. This technique is particularly suited for mounting decoupling capacitors of sizes 0603 (0.06"×0.03"), 0402 (0.04"×0.02") and 0201 (0.02"×0.01") in via areas for 1.27 mm, 1.0 mm and 0.8 mm pitch BGAs.

FIGS. 1a, 1b, 2a-2c show prior art solutions, and are described next for better illustrating the advantages of the solution proposed by this invention.

Figure 1B:
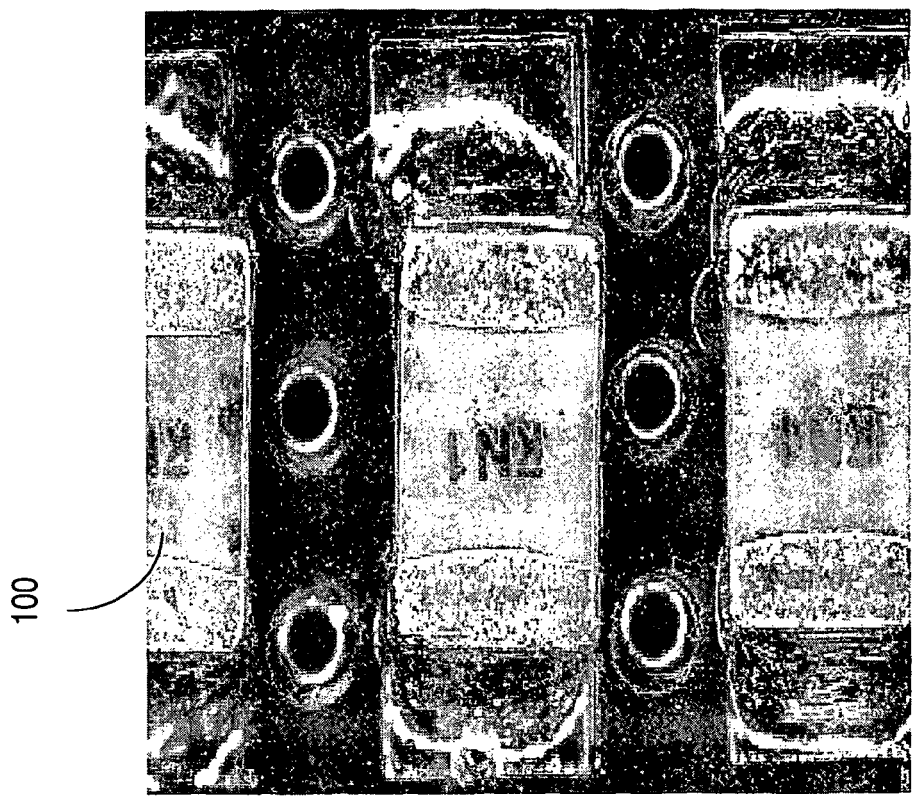
Figure 1A:
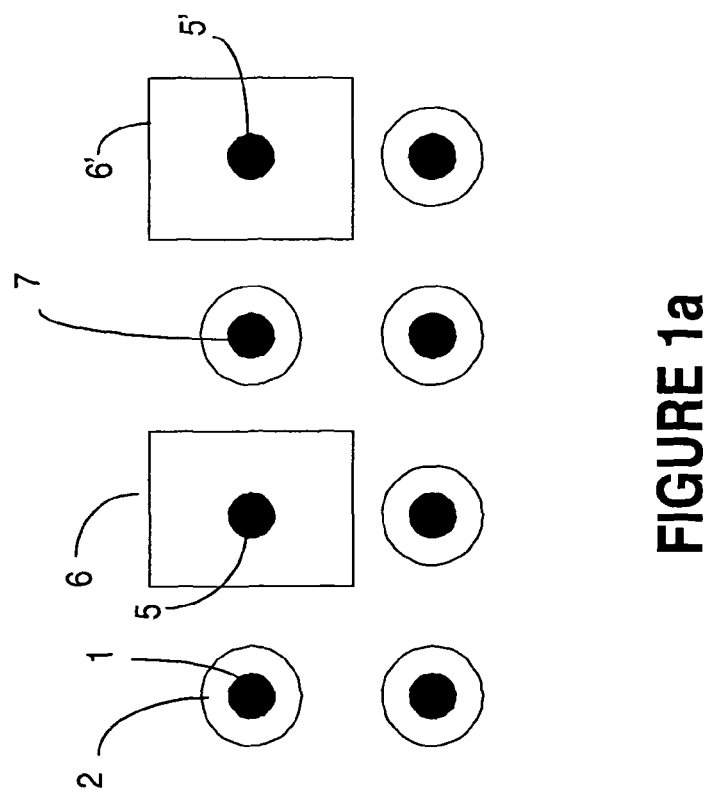
FIG. 1a shows how decoupling capacitors are mounted on a board using plated through holes (PTH) Via-in-Pad (ViP) solution.

The solution illustrated in FIGS. 1a and 1b is currently used for mounting the decoupling capacitors on a board with 1.27 mm and 1.00 mm pitch BGA components, using plated through holes (PTH). This solution is known as Via-in-Pad (ViP), and the example illustrates mounting of 0805 capacitors (0.08"×0.05").

FIG. 1a shows a PTH via, such as vias 1, 5 and 5' that go all the way through the board. Via 1 is protected with epoxy 2 at the surface of the board since it is not used for mounting components. When used for mounting a component, the respective vias are provided with a pad that provides the electrical connection.

The decoupling capacitors 100 are mounted according to Via-in-Pad solution in PTH power and ground vias 5 and respectively 5'; pads 6 and 6' are provided for soldering the leads of capacitors 100. In order for an 0805 capacitor to fit into the back side of a 1.00 mm grid, the power and ground pins 5, 5' on the IC that require decoupling, need to be separated by either a signal or unused pin, that corresponds to via 7 on the vias array. Thus, when the capacitor is mounted, via 7 is not accessible, being covered by the body of the respective capacitor 100.

This solution has the drawback that the chip is required to have the pins configured in a very specific fashion, as seen above; also the power and ground should be separated by one pin, (signal or unused). Also, the ViP solution poses some process issues in that it is causing problems in the x-ray inspection, and there is no access to the signal pin under the capacitor.

Figure 2C:
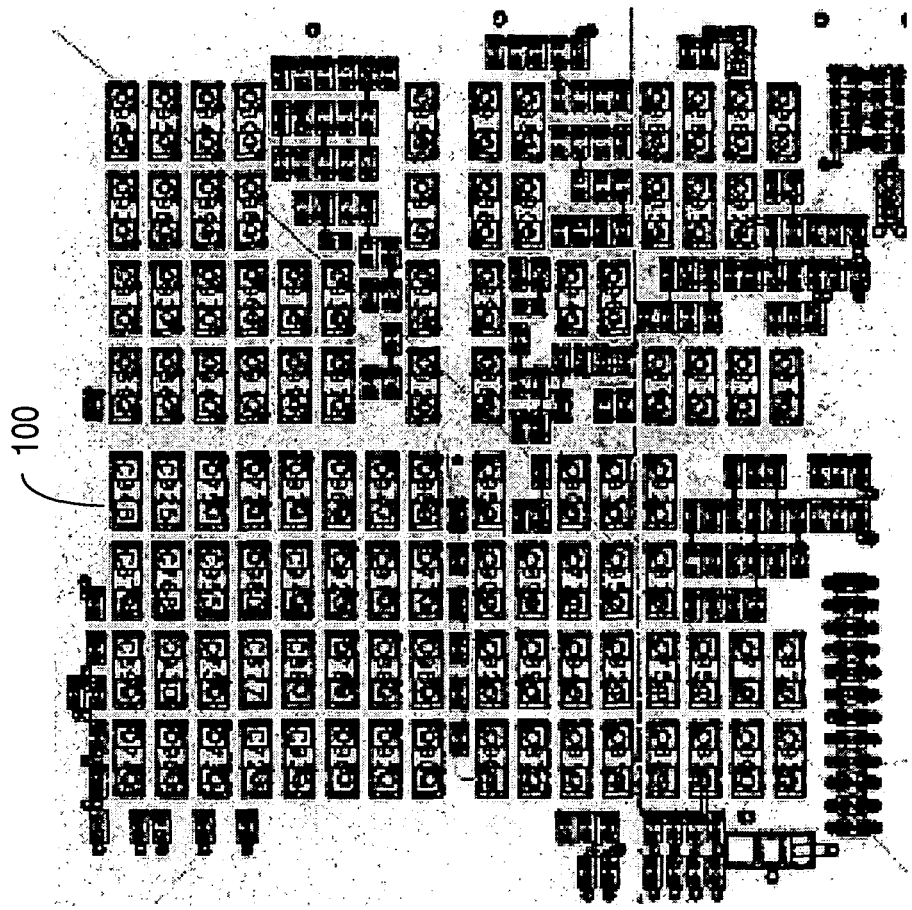
FIG. 2c is a photograph of a "parking lot" placement of decoupling capacitors obtained using vias as shown in FIGS. 2a and 2b.
Figure 2A:
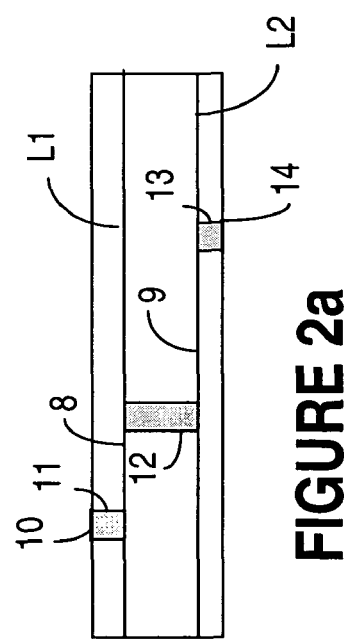
FIGS. 2a and 2b illustrate the use of HDI technology (blind and buried vias) used for connecting the leads of a BGA component.
Figure 2B:
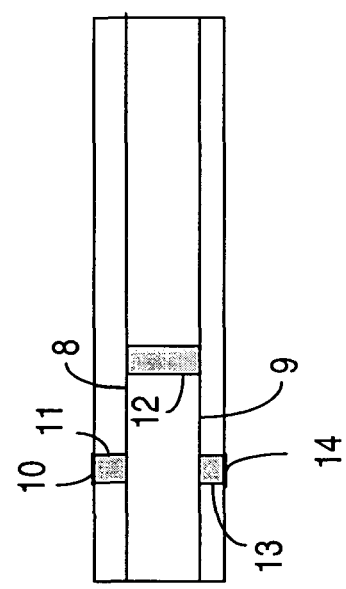

FIGS. 2a-2c show another variant that enables more flexibility in chip pin configuration. This is possible by using advanced PWB technology with blind and buried vias to allow access to the power and ground pins on the back-side of the BGA component.

FIG. 2a shows an example of a combination blind and buried vias that enable a contact between the ball pad 10 on the top-side of the board (the BGA component side) and the pad 14 on the back side. Power and ground are provided to the respective BGA component leads from within the board by way of the blind via 11 and 13, and burred via 12. In this case, pad 14 can be provided in any row and column of the vias array.

FIG. 2b shows another example of a sub-composite via, where, as before, the contact between the ball 10 on the top side of the board (the BGA component side) connects to pad 14 on the back side. In this example, the pad 14 is provided in a position on the vias array that corresponds to the position of the respective lead on the BGA component.

With this solution, component pitch, pin arrangement and capacitor size do not need to be specified; the fact that the ground and power may be placed anywhere, enables many pitches, sizes and contact arrangement combinations. As a result, a 'parking lot' like arrangement can be formed on the backside of a BGA, as shown in the photograph of FIG. 2c. This solution enables maximizing the number of passive elements (decoupling capacitors or termination resistors) that can fit into the vias array, providing a design with a high degree of freedom.

However, this solution increases increase cost of the product due to higher board costs.

FIG. 3 is a top view of the surface layer of a circuit board showing how a free space 40 can be created using shared vias. For BGA components, a via such as via 15 is connected to a ball contact pad 16 over a short connection 4 that provides the contact to a corresponding lead (ball) on the IC or a component, when mounted. As seen, a ball contact pad is arranged between two adjacent columns/rows of vias and the contact 4 forms an angle $\alpha$ with the horizontal. It is to be noted that the value of angle $\alpha$ is determined by the distance between the rows and the columns, since the ball contact pad is arranged between the rows and the columns; for a vias array with equidistant rows and columns, angle $\alpha$ can be 225° or 45°.

A shared via, shown at 30, is connected to two adjacent ball contact pads 31 and 32 placed between the via rows and columns, on both sides of the respective shared via 30. For example, the contact 4' to ball pad 31 forms the angle $\alpha$ (e.g. 225°) with the horizontal and contact 4" to ball pad 32 to the right, at an angle $\alpha = \alpha + 90$ (e.g. −45°).

As indicated above, the vias are arranged in an array, as shown at 50; FIG. 3 shows six columns Col1-Col6. For an N×K vias array, a column is referred to as Col(n), and a row as R(k). The ball pads also form a grid array 60, which has contact pads arranged in columns c1, c2, etc and rows r1, r2, etc. For an N×K contact pads array, a column is referred to as c(n), and a row as r(k). The offset between array 60 and array 50 is given to the length and angle of the ball pad connections 4, 4' and 4".

Let's assume that a plurality of shared vias occupy successive positions in a column of array 50, as shown for vias sv1, sv2, sv3, . . . svm. As shown, the shared vias make contact with the respective vias in the column c2 to the right of Col2, and to the respective vias in the column c3 to the left of Col2. Thus, shared via 30 in Col2 has a ball contact pad 31 between Col1 and Col2. No via is needed in Col3, as the respective lead of the BGA component is connected to the shared via.

We call the area depopulated of vias a "free space". If absent vias are "placed" in a specific pattern, an area free of vias may be obtained in the vias array. Various arrangements may also be designed using shared vias for obtaining such free spaces. In the example of FIG. 3, the free space 40 obtained by depopulating Col3 of vias has a width D1=2×D-via size. It is to be noted that the decoupling capacitors that fit within the free space 40 have to be smaller than D1.

For a D of 0.8 mm (0.0314"), or 1 mm (0.0393"), and a via size in the range of 0.020"to 0.030", the width D1 of the free space in the worse-case scenario would be: 0.0328 for 0.8 mm (0.0314") pitch and 0.0486" for 1 mm (0.0394") pitch. In both cases, D1 is sufficient to accommodate 0402 capacitors (0.04"×0.02") and 0201 capacitors (0.02"×0.01"). The width D1 of the free space is for the worst case scenario 0.070" for a D=1.27 mm (0.050") pitch, which is sufficient to accommodate 0603 capacitors (0.06"×0.03"), 0402 capacitors (0.04"×0.02") or 0201 capacitors (0.02"×0.01").

In general, BGA devices have a large number of ground and power leads; it is possible and desirable to design the package so as to group these leads in adjacent columns and rows to enable use of shared vias on the vias array used for mounting of the device. The present invention applies to any BGA that has at least a pair of power ball pad contacts and a pair of ground pad contacts arranged in two successive rows and columns. This is because the number of shared vias need to be minimum two, to accommodate the two leads of a passive element (capacitor or resistor). In other words, the invention applies to a BGA that has at least a 2×2 sub-array in the ball grid array 60 for connecting two consecutive power and ground vias.

As a note, both arrays 50 and 60 may not necessarily include vias/ball contact pads in all columns and rows. Various designs with depopulated vias/ball contact pads are currently available; however this specification refers to these patterns as arrays. The pattern obtained by depopulating the vias of the vias array 50 according to the invention is referred to as a "modified vias array".

It is also to be noted that the terms "columns" and "rows" are relative terms, that depend on the representation of the respective array in the drawings. Thus, if the specification refers to a via or a pad identified by a row and a column, the same description is applicable if the column and row identification is interchanged.

Also, an even number 2m of shared vias is needed to accommodate m capacitors; additional shared vias (an odd or even number of additional vias) may be provisioned in the vias array, but this is not relevant to the invention. It is also to be noted that shared vias may be used for signal pins if the design requires. Again, a person skilled in the art will understand that this is not relevant to the invention, which is concerned with placement of decoupling capacitors.

Figure 4B:
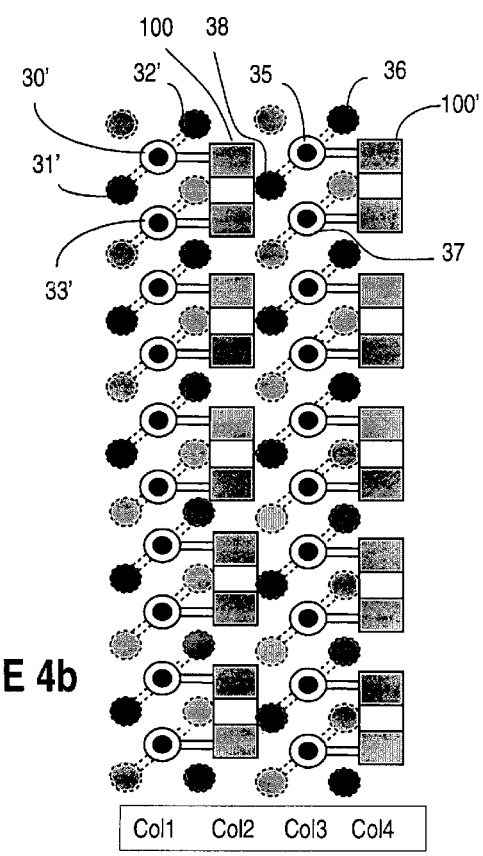
FIG. 4b is a back view of the circuit board showing another example of a shared via pattern for providing a free space for mounting the decoupling capacitors according to the invention.

FIGS. 4a and 4b show examples of shared via patterns for providing a free space for mounting the decoupling capacitors according to the invention. These Figures show two variants of shared vias, a first variant where the ball pads that share a via form an angle, and another variant where the ball pads that share a via are co-linear.

FIG. 4a is a back side view of the PWB showing five columns of the vias array, namely Col1-Col5. It is to be noted that the ball pads are shown in dotted lines since they are on the top side of the PWB; only the vias such as 15, 30, 33 and the respective via pads occupy board space on the back-side. In this arrangement, shared vias 30 (respectively 33, etc) are provided in Col3, and the respective ball contact pads columns are provided to the left and the right of Col3. Thus, the column of ball pads including pad 31 (respectively 34) is placed between Col2 and Col3, and the column of ball pads including pad 32 (respectively 35) is placed between Col3 and Col4. The vias in Col1, Col 2, and Col 5, such as via 15, are not shared, but are associated with a respective ball contact pad 16.

There are no vias in Col4, providing a free space for both placing traces and placing decoupling capacitors 100, as discussed in connection with FIG. 3. The leads of each capacitor 100 are soldered to a respective power and ground via, as shown. For example, the capacitor denoted with 100 has the power lead connected to via 30, and the ground lead connected to via 33. The body of the capacitor 100 fits into the free space without obstructing any via, while the respective ball pads 31, 32, 34 and 35 are used to connect the leads of the BGA component.

FIG. 4b is a back side view of the PWB showing four columns of the vias array, namely Col1-Col4. In this arrangement, shared vias 30' and 33', etc. are provided in Col1 and shared vias 35 and 37 are provided in Col3. The ball pad contacts are arranged co-linearly, to form columns to the left and the right of Col1 and Col3, as shown. Thus, the column of ball contact pads including pad 31' is placed to the left of Col1, and the column of ball pads including pad 32' is placed between Col1 and Col2. There are no vias in Col2 and Col4, providing a respective free space for placing decoupling capacitors 100 in Col2 and capacitors 100' in Col4. The power lead of each capacitor 100 is soldered to via 30', and the ground lead is connected to via 33'. Similarly, the power lead of a capacitor 100' is soldered to via 35, and the ground lead is connected to via 37. The body of the respective capacitor 100, 100' fits into the free space without obstructing any via, while the respective ball contact pads on the top side of the PWB are used to connect the leads of the BGA component.

Figure 4C:
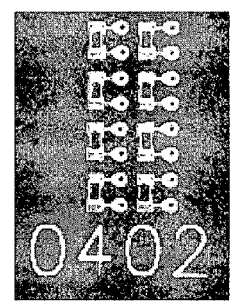
FIG. 4c is a photograph of decoupling capacitors placed on the back side of a PWB under the BGA component.

FIG. 4c is a photograph of decoupling capacitors placed on the back side of a PWB under the BGA component.

Using this technique columns/rows or partial columns/ rows of free spaces may be obtained in the BGA, by depopulating columns/rows or partial columns/rows of vias. Partially depopulating vias from the BGA is possible as indicated above by using shared vias, to make room for decoupling capacitors. When the solution provided by this invention is coupled with a corresponding packaging solution, a desired number of decoupling capacitors may be placed on the back of the BGA array. As a result, high-performance operation of the electrical circuits in the respective IC may be obtained.

In addition, there are no vias under the decoupling capacitors in the solution described above. This means that the solution entices no process related issues since it uses standard PTH vias for routing and no ViP is required.

We claim:

1. A printed wiring board (PWB) for mounting a high performance integrated circuit, comprising:
    on a top side of said PWB, a modified via array with BGA columns and BGA row of ball connection pads;
    a modified vias array of plated through hole (PTH) vias, with each via column Col(n) arranged between two respective BGA columns c(n) and c(n+1) and each via row R(k) arranged between two respective BGA rows r(k) and r(k−1), wherein 2m vias of said via column Col(i) placed in successive via rows R(j) to R(j+2m−1) of said modified vias array are depopulated to obtain a free space on the back side of said PWB, wherein 2m corresponding vias in a via column Col(i+1) adjacent to said via column Col(i) and placed in said successive via rows R(j) to R(j+2m−1) of said vias array are shared vias, wherein n≧1, k≧2, 2≦i<n and j<k, and wherein a first shared via in said via column Col(i+1) and said via row R(j) provides a power contact to a first associated ball contact pad in said via column c(i+1) and said via row r(j) and to a second associated ball contact pad in said via column c(i+2) and said via row r(j).

2. The PWB of claim 1, wherein said free space has a width D1 equal to twice the pitch D of said vias array less a via size, for accommodating m passive elements of a substantially similar width D1.

3. The PWB of claim 2, wherein m is at least one.

4. The PWB of claim 2, wherein said passive elements are capacitors.

5. The PWB of claim 4, wherein the capacitors have a size of substantially 0.06"×0.03".

6. The PWB of claim 4, wherein the capacitors have a size of substantially 0.04"×0.02".

7. The PWB of claim 4, wherein the capacitors have a size of substantially 0.02"×0.01".

8. The PWB of claim 2, wherein said passive elements are resistors.

9. The PWB of claim 8, wherein the resistors have a size of substantially 0.06"×0.03".

10. The PWB of claim 8, wherein the resistors have a size of substantially 0.04"×0.02".

11. The PWB of claim 8, wherein the resistors have a size of substantially 0.02"×0.01".

12. The PWB of claim 1, wherein a second shared via in said via column Col(i+1) and said via row R(j+1) provides a ground contact to a third associated ball contact pad in said via column c(i+1) and said via row r(j+1) and to a fourth associated ball contact pad in said via column c(i+2) and said via row r(j).

* * * * *

UNITED STATES PATENT AND TRADEMARK OFFICE
CERTIFICATE OF CORRECTION

PATENT NO. : 7,738,259 B2 Page 1 of 1
APPLICATION NO. : 10/761343
DATED : June 15, 2010
INVENTOR(S) : Alex L. Chan, Paul Brown and Charles M. Elliott It is certified that error appears in the above-identified patent and that said Letters Patent is hereby corrected as shown below:

Column 8, Claim 1, line 14, please change "row" to "rows"

Signed and Sealed this

Thirteenth Day of July, 2010

David J. Kappos
*Director of the United States Patent and Trademark Office*